(12) United States Patent
Shen et al.

(10) Patent No.: US 9,324,712 B2
(45) Date of Patent: Apr. 26, 2016

(54) INTEGRATED CIRCUIT AND RELATED MANUFACTURING METHOD

(71) Applicants: Semiconductor Manufacturing International (Beijing) Corporation, Beijing (CN); Semiconductor Manufacturing International (Shanghai) Corporation, Shanghai (CN)

(72) Inventors: Yi Hua Shen, Shanghai (CN); Yun Chu Yu, Shanghai (CN); Hao Zhong, Shanghai (CN)

(73) Assignees: SEMICONDUCTOR MANUFACTURING INTERNATIONAL (BEIJING) CORPORATION (CN); SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/581,671

(22) Filed: Dec. 23, 2014

(65) Prior Publication Data
US 2015/0303193 A1    Oct. 22, 2015

(30) Foreign Application Priority Data
Apr. 22, 2014  (CN) .......................... 2014 1 0163001

(51) Int. Cl.
| H01L 27/08 | (2006.01) |
| H01L 27/088 | (2006.01) |
| H01L 21/66 | (2006.01) |
| H01L 21/8234 | (2006.01) |
| H01L 27/02 | (2006.01) |

(52) U.S. Cl.
CPC .... *H01L 27/0886* (2013.01); *H01L 21/823431* (2013.01); *H01L 21/823437* (2013.01); *H01L 21/823475* (2013.01); *H01L 22/14* (2013.01); *H01L 22/22* (2013.01); *H01L 27/0207* (2013.01)

(58) Field of Classification Search
CPC ................ H01L 29/78; H01L 27/0886; H01L 21/823431; H01L 27/0883
USPC .......................................................... 257/318
See application file for complete search history.

(56) References Cited

U.S. PATENT DOCUMENTS

| 2007/0108528 A1* | 5/2007 | Anderson et al. ............. 257/365 |
| 2012/0032171 A1* | 2/2012 | Saito et al. ...................... 257/57 |
| 2012/0062538 A1* | 3/2012 | Koyama ........................ 345/211 |
| 2012/0292614 A1* | 11/2012 | Matsubayashi .................. 257/43 |
| 2012/0293202 A1* | 11/2012 | Nishijima et al. ............... 326/41 |
| 2013/0077385 A1* | 3/2013 | Yamazaki et al. ............. 365/149 |
| 2013/0119380 A1* | 5/2013 | Koyama et al. .................. 257/43 |
| 2013/0140569 A1* | 6/2013 | Yoneda et al. ................... 257/57 |
| 2014/0361273 A1* | 12/2014 | Nozawa .......................... 257/40 |
| 2014/0367673 A1* | 12/2014 | Takahashi ....................... 257/43 |
| 2015/0108476 A1* | 4/2015 | Kato ............................... 257/43 |

* cited by examiner

*Primary Examiner* — Nathan Ha
(74) *Attorney, Agent, or Firm* — Innovation Counsel LLP

(57) ABSTRACT

A method for manufacturing an integrated circuit may include the following steps: forming a first transistor, which includes a first active region; forming a second transistor, which includes a second active region; forming a third transistor, which includes a gate electrode that overlaps each of the first active region and the second active region; and providing a predetermined voltage to the gate electrode for turning off the third transistor to isolate the first transistor from the second transistor.

20 Claims, 4 Drawing Sheets

INTEGRATED CIRCUIT AND RELATED MANUFACTURING METHOD

CROSS-REFERENCE TO RELATED APPLICATION

This application claims priority to and benefit of Chinese Patent Application No. 201410163001.8, filed on 22 Apr. 2014, the Chinese Patent Application being incorporated herein by reference in its entirety.

BACKGROUND OF THE INVENTION

The present invention is related to an integrated circuit and a method for manufacturing the integrated circuit.

An electronic device may include an integrated circuit that includes a plurality of transistors. The size of the electronic device may be affected by the size of the integrated circuit.

SUMMARY

An embodiment of the present invention may be related to a method for manufacturing an integrated circuit. The method may include the following steps: forming a first transistor, which may include a first active region configured for conducting a first current; forming a second transistor, which may include a second active region configured for conducting a second current; forming a third transistor, which may include a third-transistor gate electrode, the third-transistor gate electrode may overlap each of the first active region and the second active region; and providing a predetermined voltage to the third-transistor gate electrode for turning off the third transistor to isolate the first transistor from the second transistor.

The first transistor may include a first-transistor gate electrode configured for controlling the first active region. The second transistor may include a second-transistor gate electrode configured for controlling the second active region. The third-transistor gate electrode may be positioned between the first-transistor gate electrode and the second-transistor gate electrode in a plan view of the integrated circuit.

The third-transistor gate electrode may overlap at least one of the first active region and the second active region in a direction perpendicular to a plane of a plan view of the integrated circuit.

The third-transistor gate electrode may overlap each of the first active region and the second active region in a direction perpendicular to a plane of a plan view of the integrated circuit.

The third transistor may be a P-type metal-oxide-semiconductor field-effect transistor (PMOS), and the predetermined voltage may be a positive supply voltage (Vdd).

The third transistor may be an N-type metal-oxide-semiconductor field-effect transistor (NMOS), and the predetermined voltage may be a negative supply voltage (Vss).

The method may include performing an electrical rule check to verify whether the third-transistor gate electrode is at the predetermined voltage and/or to verify whether the third transistor is in an off state.

The method may include modifying an electrical connection associated with the third-transistor gate electrode based on a result of the electrical rule check to ensure that the third-transistor gate electrode is at the predetermined voltage and/or to ensure that the third transistor is in the off state.

A distance between the first active region and the second active region may be less than a width of the third-transistor gate electrode in a direction perpendicular to an extension direction of the third-transistor gate electrode.

The first active region may overlap the second active region in a direction perpendicular to a plane of a plan view of the integrated circuit.

The first transistor may include a first fin structure, which may overlap and/or contact the third-transistor gate electrode.

The second transistor may include a second fin structure, which may also overlap and/or contact the third-transistor gate electrode.

The method may include the following steps: forming a first edge gate electrode, which may overlap an edge of the first active region; and forming a second edge gate electrode, which may overlap an edge the second active region. The third-transistor gate electrode may be formed using at least one of the first edge gate electrode and the second edge gate electrode. The first edge gate electrode and the second edge gate electrode may be combined to form the third-transistor gate electrode and/or to function as the third-transistor gate electrode.

An embodiment of the present invention may be related to an integrated circuit. The integrated circuit may include the following elements: a first transistor, which may include a first active region configured for conducting a first current; a second transistor, which may include a second active region configured for conducting a second current; and a third transistor, which may include a third-transistor gate electrode. The third-transistor gate electrode may overlap each of the first active region and the second active region. The third transistor may be (and remain) in an off state.

The first transistor may include a first-transistor gate electrode configured for controlling the first active region. The second transistor may include a second-transistor gate electrode configured for controlling the second active region. The third-transistor gate electrode may be positioned between the first-transistor gate electrode and the second-transistor gate electrode in a plan view of the integrated circuit.

The third-transistor gate electrode may overlap at least one of the first active region and the second active region in a direction perpendicular to a plane of a plan view of the integrated circuit.

The third-transistor gate electrode may overlap each of the first active region and the second active region in a direction perpendicular to a plane of a plan view of the integrated circuit.

The third transistor may be a P-type metal-oxide-semiconductor field-effect transistor (PMOS), and the third-transistor gate electrode may receive a positive supply voltage (Vdd).

The third transistor may be an N-type metal-oxide-semiconductor field-effect transistor (NMOS), and the third-transistor gate electrode may receive a negative supply voltage (Vss).

A distance between the first active region and the second active region may be less than a width of the third-transistor gate electrode in a direction perpendicular to an extension direction of the third-transistor gate electrode.

The first active region may overlap the second active region in a direction perpendicular to a plane of a plan view of the integrated circuit.

The first transistor may include a first fin structure, which may overlap and/or contact the third-transistor gate electrode.

The second transistor may include a second fin structure, which may also overlap and/or contact the third-transistor gate electrode.

According to embodiments of the present invention, the first transistor and the second transistor may not be substantially spaced from each other. Therefore, the size of the integrated circuit may be substantially minimized. Advantageously, the integrated circuit may facilitate miniaturization of an electronic device that includes the integrated circuit.

The above summary may be related to one or more of many embodiments of the invention disclosed herein and may be not intended to limit the scope of the invention.

DETAILED DESCRIPTION

Figure 1:
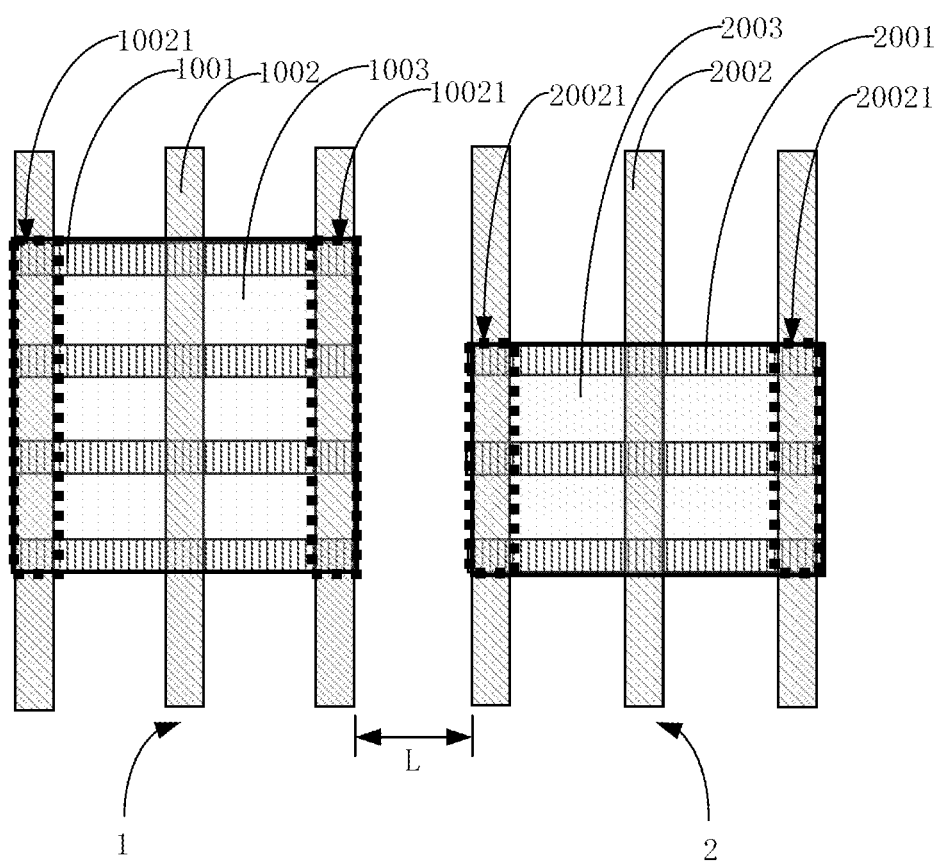
FIG. 1 shows a schematic plan view that illustrates an integrated circuit in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1 shows a schematic plan view that illustrates an integrated circuit in accordance with one or more embodiments of the present invention. The integrated circuit may include a first transistor 1 and a second transistor 2. The first transistor 1 may include a fin structure 1001, a gate electrode 1002, an active region 1003, and edge gate electrodes 10021. The second transistor 2 may include a fin structure 2001, a gate electrode 2002, an active region 2003, and edge gate electrodes 20021. The source electrode of the first transistor 1 may not be electrically connected to the source electrode of the second transistor 2, and/or the drain electrode of the first transistor 1 may not be electrically connected to the drain electrode of the second transistor 2. The first transistor 1 may be substantially spaced from the second transistor 2 by a significant distance L, which may be greater than or equal to a width of at least one of the gate electrodes 1002, 10021, 2002, and 20021.

Figure 2:
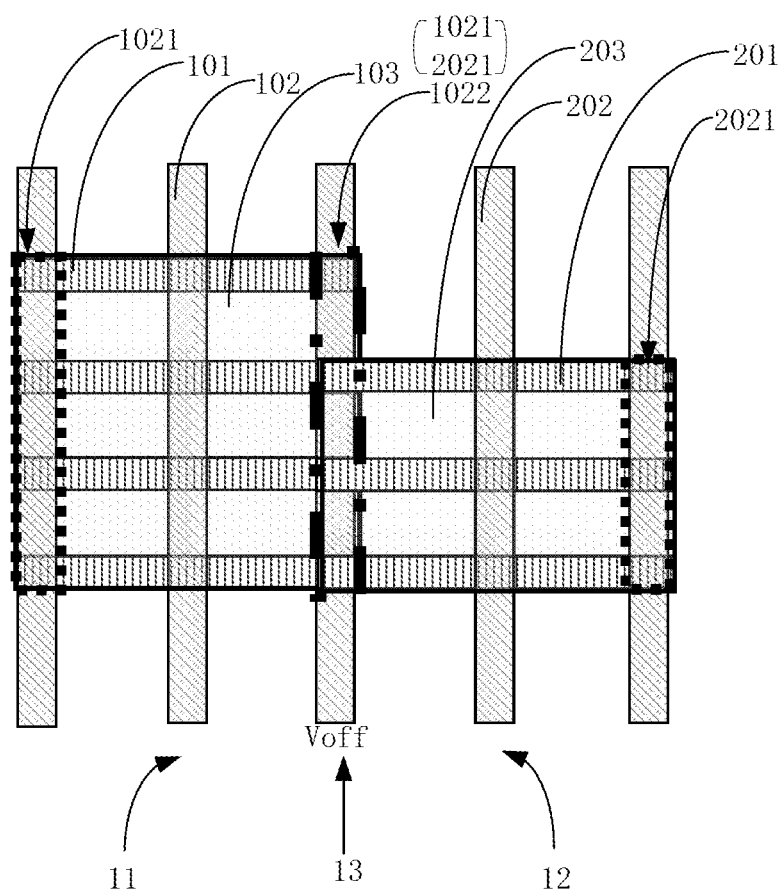
FIG. 2 shows a schematic plan view that illustrates an integrated circuit in accordance with one or more embodiments of the present invention.
Figure 3:
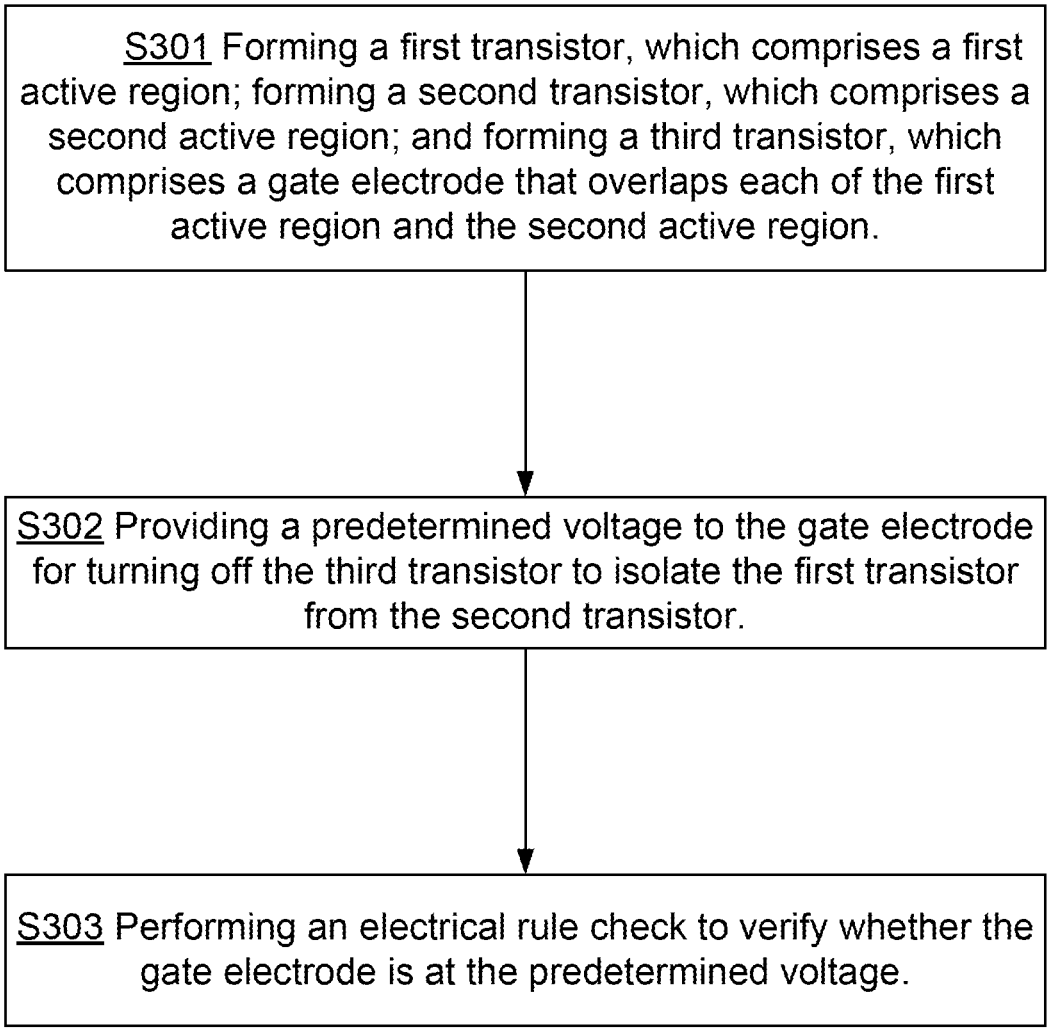
FIG. 3 shows a flowchart that illustrates a method for manufacturing an integrated circuit in accordance with one or more embodiments of the present invention.

FIG. 2 shows a schematic plan view that illustrates an integrated circuit in accordance with one or more embodiments of the present invention. FIG. 3 shows a flowchart that illustrates a method for manufacturing an integrated circuit, e.g., the integrated circuit illustrated in FIG. 3, in accordance with one or more embodiments of the present invention.

Referring to FIG. 3, the method may include a step S301, a step S302, and a step S303.

Referring to FIG. 3 and FIG. 2, the step S301 may include the following sub-steps: forming a first transistor 11, which may include a first active region 103. The first active region 103 may be a semiconductor member and may be configured for conducting a first current.

The step S301 may further include forming a second transistor 12, which may include a second active region 203. The second active region 203 may be a semiconductor member and may be configured for conducting a second current. A source electrode of the first transistor 11 may not be electrically connected to a source electrode of the second transistor 12, and/or a drain electrode of the first transistor 11 may not be electrically connected to a drain electrode of the second transistor 12.

The step S301 may further include forming a third transistor 13, which may include a third-transistor gate electrode 1022. The third-transistor gate electrode 1022 may overlap each of the first active region 103 and the second active region 203. The third transistor 13 may include a portion of the first active region 103 that overlaps the third-transistor gate electrode 1022 and may include a portion of the second active region 203 that overlaps the third-transistor gate electrode 1022.

The step S302 may include providing a predetermined voltage Voff to the third-transistor gate electrode for turning off the third transistor 13. Therefore, the first transistor 11 and the second transistor 12 may be electrically isolated (and/or electrically insulated) from each other and may operate properly without interfering with each other. In an embodiment, the third transistor 13 may be a P-type metal-oxide-semiconductor field-effect transistor (PMOS), and the predetermined voltage Voff may be a positive supply voltage (Vdd). In an embodiment, the third transistor 13 may be an N-type metal-oxide-semiconductor field-effect transistor (NMOS), and the predetermined voltage Voff may be a negative supply voltage (Vss).

The step S303 may include performing an electrical rule check to verify whether the third-transistor gate electrode 1022 is at the predetermined voltage Voff and/or to verify whether the third transistor 13 is in an off state, for ensuring the isolation between the first transistor 11 and the second transistor 12. In an embodiment, the electrical rule check may examine whether the third-transistor gate electrode 1022 of a PMOS third transistor 13 receives the Vdd. In an embodiment, the electrical rule check may examine whether the third-transistor gate electrode 1022 of an NMOS third transistor 13 receives the Vss.

The method may include modifying (and correcting) an electrical connection associated with the third-transistor gate electrode 1022 based on a result of the electrical rule check (e.g., in case the result indicates an error) to ensure that the third-transistor gate electrode 1022 is at the predetermined voltage Voff and/or to ensure that the third transistor 13 is in the off state.

The first transistor 11 may include a first-transistor gate electrode 102 configured for controlling the first active region 103 in the first transistor 11. The second transistor 12 may include a second-transistor gate electrode 202 configured for controlling the second active region 203 in the second transistor 12. The third-transistor gate electrode 1022 may be positioned between the first-transistor gate electrode 102 and the second-transistor gate electrode 202 in a plan view of the integrated circuit.

The third-transistor gate electrode 1022 may overlap at least one of the first active region 103 and the second active region 203 in a direction perpendicular to a plane of the plan view of the integrated circuit. In an embodiment, the third-transistor gate electrode 1022 may overlap each of the first active region 103 and the second active region 203 in the direction perpendicular to the plane of the plan view of the integrated circuit.

In an embodiment, a distance between the first active region 103 and the second active region 203 may be less than a width of the third-transistor gate electrode 1022 in a direction perpendicular to an extension direction of the third-transistor gate electrode 1022. In an embodiment, the first active region 103 may overlap the second active region 203 in a direction perpendicular to a plane of a plan view of the integrated circuit. In an embodiment, an edge portion of the first active region 103 may overlap an edge portion the second active region 203 in the direction perpendicular to the plane of the plan view of the integrated circuit.

The first transistor 11 may include one or more fin structures 101, which may overlap and/or contact the third-transistor gate electrode 1022. The second transistor 12 may include one or more fin structures 201, which may overlap and/or contact the third-transistor gate electrode 1022.

The method may include the following steps: forming a first set of edge gate electrodes 1021, which may (respectively) overlap edges of the first active region 103; and forming a second set of edge gate electrodes 2021, which may (respectively) overlap edges the second active region 203. The third-transistor gate electrode 1022 may be formed using at least one of the edge gate electrodes 1021 and/or at least one of the edge gate electrodes 2021. In an embodiment, an edge gate electrode 1021 may function as the third-transistor gate electrode 1022. In an embodiment, an edge gate electrode 2021 may function as the third-transistor gate electrode 1022. In an embodiment, an edge gate electrode 1021 and an edge gate electrode 2021 may be combined to form the third-transistor gate electrode 1022 and/or to function as the third-transistor gate electrode 1022.

According to embodiments of the present invention, the first transistor 11 and the second transistor 12 may overlap each other and/or may be positioned substantially close to each other. Therefore, the size of the integrated circuit may be substantially minimized. Advantageously, the integrated circuit may facilitate miniaturization of an electronic device that includes the integrated circuit.

Figure 4:
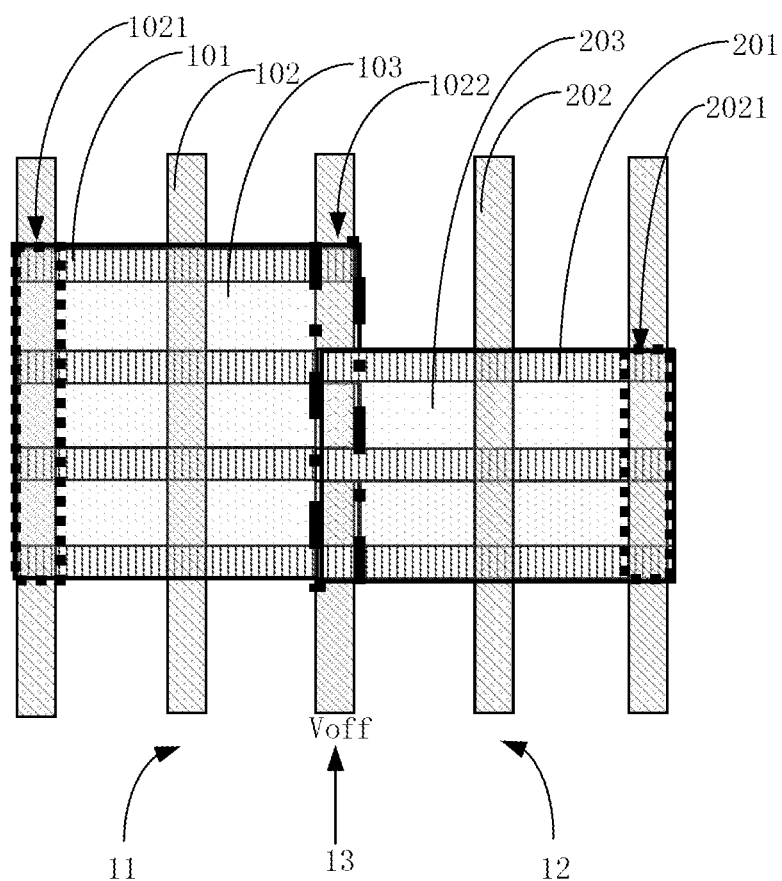
FIG. 4 shows a schematic plan view that illustrates an integrated circuit in accordance with one or more embodiments of the present invention.

FIG. 4 shows a schematic plan view that illustrates an integrated circuit in accordance with one or more embodiments of the present invention. The integrated circuit may include one or more of the features and advantages discussed with reference to FIG. 2 and FIG. 3.

The integrated circuit may include the following elements: a first transistor 11, which may include a first active region 103 configured for conducting a first current; a second transistor 12, which may include a second active region 203 configured for conducting a second current; and a third transistor 13, which may include a third-transistor gate electrode 1022. The third-transistor gate electrode 1022 may overlap each of the first active region 103 and the second active region 203. The third transistor 13 may be (and remain) in an off state.

In an embodiment, the third transistor 13 may be a P-type metal-oxide-semiconductor field-effect transistor (PMOS), and the third-transistor gate electrode 1022 may receive a positive supply voltage (Vdd). In an embodiment, the third transistor 13 may be an N-type metal-oxide-semiconductor field-effect transistor (NMOS), and the third-transistor gate electrode 1022 may receive a negative supply voltage (Vss).

The first transistor 11 may include a first-transistor gate electrode 102 configured for controlling the first active region 103. The second transistor 12 may include a second-transistor gate electrode 202 configured for controlling the second active region 203. The third-transistor gate electrode 1022 may be positioned between the first-transistor gate electrode 102 and the second-transistor gate electrode 202 in a plan view of the integrated circuit.

The first transistor 11 may include a first fin structure 101, which may overlap and/or contact the third-transistor gate electrode 1022. The second transistor 12 may include a second fin structure 201, which may also overlap and/or contact the third-transistor gate electrode 1022.

The third-transistor gate electrode 1022 may overlap at least one of the first active region 103 and the second active region 203 in a direction perpendicular to a plane of a plan view of the integrated circuit. In an embodiment, the third-transistor gate electrode 1022 may overlap each of the first active region 103 and the second active region 203 in the direction perpendicular to the plane of the plan view of the integrated circuit.

In an embodiment, a distance between the first active region 103 and the second active region 203 may be less than a width of the third-transistor gate electrode 1022 in a direction perpendicular to an extension direction of the third-transistor gate electrode 1022. In an embodiment, (an edge portion of) the first active region 103 may overlap (an edge portion of) the second active region 203 in a direction perpendicular to a plane of a plan view of the integrated circuit.

According to embodiments of the present invention, the first transistor 11 and the second transistor 12 may not be substantially spaced from each other. Therefore, the size of the integrated circuit may be substantially minimized. Advantageously, the integrated circuit may facilitate miniaturization of an electronic device that includes the integrated circuit.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for manufacturing an integrated circuit, the method comprising:
    forming a first transistor comprising a first active region;
    forming a second transistor comprising a second active region;
    forming a third transistor comprising a gate electrode, wherein the gate electrode is formed to overlap each of the first active region and the second active region in a configuration that isolates the first transistor from the second transistor when the third transistor is in an off state; and
    providing a predetermined voltage to the gate electrode for turning off the third transistor to isolate the first transistor from the second transistor.

2. The method of claim 1, wherein the third transistor is a P-type metal-oxide-semiconductor field-effect transistor, and wherein the predetermined voltage is a positive supply voltage.

3. The method of claim 1, wherein the third transistor is an N-type metal-oxide-semiconductor field-effect transistor, and wherein the predetermined voltage is a negative supply voltage.

4. The method of claim 1, further comprising: performing an electrical rule check to verify whether the gate electrode is at the predetermined voltage.

5. The method of claim 4, further comprising: modifying an electrical connection associated with the gate electrode based on a result of the electrical rule check.

6. The method of claim 1, wherein a distance between the first active region and the second active region is less than a width of the gate electrode in a direction perpendicular to an extension direction of the gate electrode.

7. The method of claim 1, wherein the first active region overlaps the second active region in a direction perpendicular to a plane of a plan view of the integrated circuit.

8. The method of claim 1, wherein the first transistor comprises a first fin structure, which overlaps the gate electrode.

9. The method of claim 8, wherein the second transistor comprises a second fin structure, which overlaps the gate electrode.

10. The method of claim 1, further comprising:
    forming a first edge gate electrode, which overlaps an edge of the first active region; and
    forming a second edge gate electrode, which overlaps an edge the second active region, wherein the gate electrode is formed using at least one of the first edge gate electrode and the second edge gate electrode.

11. The method of claim 1,
wherein the first transistor comprises a first-transistor gate electrode,
    wherein the second transistor comprises a second-transistor gate electrode, and
    wherein the gate electrode is positioned between the first-transistor gate electrode and the second-transistor gate electrode in a plan view of the integrated circuit.

12. An integrated circuit comprising:
a first transistor, which comprises a first active region;
a second transistor, which comprises a second active region; and
a third transistor, which comprises a gate electrode that overlaps each of the first active region and the second active region, wherein the third transistor is configured to electrically isolate the first transistor from the second transistor in response to the third transistor being in an off state.

13. The integrated circuit of claim 12, wherein the third transistor is a P-type metal-oxide-semiconductor field-effect transistor, and wherein the gate electrode receives a positive supply voltage.

14. The integrated circuit of claim 12, wherein the third transistor is an N-type metal-oxide-semiconductor field-effect transistor, and wherein the gate electrode receives a negative supply voltage.

15. The integrated circuit of claim 12, wherein a width of the gate electrode in a direction perpendicular to an extension direction of the gate electrode is greater than a distance between the first active region and the second active region.

16. The integrated circuit of claim 12, wherein the first active region overlaps the second active region in a direction perpendicular to a plane of a plan view of the integrated circuit.

17. The integrated circuit of claim 12, wherein the first transistor comprises a first fin structure, which overlaps the gate electrode.

18. The integrated circuit of claim 17, wherein the second transistor comprises a second fin structure, which overlaps the gate electrode.

19. The integrated circuit of claim 12, wherein the first transistor comprises a first-transistor gate electrode, wherein the second transistor comprises a second-transistor gate electrode, and wherein the gate electrode is positioned between the first-transistor gate electrode and the second-transistor gate electrode in a plan view of the integrated circuit.

20. The integrated circuit of claim 12, wherein the gate electrode overlaps each of the first active region and the second active region in a direction perpendicular to a plane of a plan view of the integrated circuit.

* * * * *